(12) United States Patent
Nakashima et al.

(10) Patent No.: US 10,698,133 B2
(45) Date of Patent: *Jun. 30, 2020

(54) PHOTOELECTRIC SENSOR WITH ADJUSTMENT PART ON AN INCLINED SURFACE

(71) Applicant: OMRON Corporation, Kyoto (JP)

(72) Inventors: Hirotaka Nakashima, Fukuchiyama (JP); Kazunari Komai, Kameoka (JP)

(73) Assignee: OMRON Corporation, Kyoto (JP)

( * ) Notice: Subject to any disclaimer, the term of this patent is extended or adjusted under 35 U.S.C. 154(b) by 76 days.

This patent is subject to a terminal disclaimer.

(21) Appl. No.: 16/129,821

(22) Filed: Sep. 13, 2018

(65) Prior Publication Data

US 2019/0101667 A1    Apr. 4, 2019

(30) Foreign Application Priority Data

Oct. 2, 2017 (JP) .................................. 2017-192856

(51) Int. Cl.
*G01V 8/12* (2006.01)
*H03K 17/78* (2006.01)
(Continued)

(52) U.S. Cl.
CPC ............... *G01V 8/12* (2013.01); *G01B 11/00* (2013.01); *G01C 3/02* (2013.01); *G01S 7/4813* (2013.01);
(Continued)

(58) Field of Classification Search
CPC ....... G01S 17/026; G01S 7/4813; G01V 8/12; G01P 1/02; H01H 35/00; G01C 3/02; H03K 17/78
(Continued)

(56) References Cited

U.S. PATENT DOCUMENTS 4,021,665 A * 5/1977 Haas ....................... H01L 31/16
                                                    250/239
7,053,786 B2    5/2006 Sugiyama
(Continued)

FOREIGN PATENT DOCUMENTS

DE    29810418    10/1998
JP    H05167413    7/1993
JP    2011077050    4/2011

OTHER PUBLICATIONS

"Search Report of Europe Counterpart Application", dated Mar. 7, 2019, p. 1-p. 7.

*Primary Examiner* — Que Tan Le
(74) *Attorney, Agent, or Firm* — JCIPRNET

(57) ABSTRACT

The photoelectric sensor includes a light projecting part emitting light, a light receiving part receiving light, a housing housing the light projecting part and the light receiving part, a setting part receiving an input operation from outside to set a threshold value, and an adjustment part receiving an input operation from outside to finely adjust the set threshold value. The housing includes a front surface having a light projecting/receiving surface allowing light from the light projecting part and light to the light receiving part to pass, a rear surface located on a side opposite to the front surface, a top surface adjacent to the front surface and extending in a direction orthogonal to the front surface and the rear surface, and an inclined surface inclined with respect to and connecting the top surface and the rear surface. The adjustment part is provided on the inclined surface.

7 Claims, 4 Drawing Sheets

(51) Int. Cl.
  *G01C 3/02*     (2006.01)
  *H01H 35/00*    (2006.01)
  *G01S 7/481*    (2006.01)
  *G01S 17/46*    (2006.01)
  *G01B 11/00*    (2006.01)
  *G01S 17/02*    (2020.01)
  *G01S 17/04*    (2020.01)

(52) U.S. Cl.
  CPC .............. *G01S 17/02* (2013.01); *G01S 17/04* (2020.01); *G01S 17/46* (2013.01); *H01H 35/00* (2013.01); *H03K 17/78* (2013.01)

(58) Field of Classification Search
  USPC .................................................. 250/239, 551
  See application file for complete search history.

(56) References Cited

U.S. PATENT DOCUMENTS

| | | | |
|---|---|---|---|
| 10,338,087 B2* | 7/2019 | Nakashima | G01V 8/12 |
| 2006/0279867 A1 | 12/2006 | Deguchi et al. | |

\* cited by examiner

PHOTOELECTRIC SENSOR WITH ADJUSTMENT PART ON AN INCLINED SURFACE

CROSS-REFERENCE TO RELATED APPLICATION

This application claims the priority of Japan patent application serial no. 2017-192856, filed on Oct. 2, 2017. The entirety of the above-mentioned patent application is hereby incorporated by reference herein and made a part of this specification.

BACKGROUND

Technical Field

The disclosure relates to a photoelectric sensor.

Description of Related Art

Photoelectric sensors have various detection methods and configurations so as to correspond to various detection environments and installation sites. For example, in terms of configurations, the photoelectric sensors are categorized into a built-in amplifier type with a built-in amplifier in the sensor head and an amplifier separate type in which the sensor head and the amplifier are separated. In recent years, due to adaptation to robotization and diversification of work according to taste diversity, etc., a distance-settable built-in amplifier type photoelectric sensor capable of detecting a longer distance is required, and the photoelectric sensor that displays the value of the distance to the object being detected is also known.

For example, in the distance-settable built-in amplifier type photoelectric sensor described in Patent Document 1 (Japanese Laid-Open No. 2011-77050), a light projecting/receiving part is provided on the front surface of a rectangular parallelepiped shaped housing, a display part and two adjustment switches are provided on the rear surface, also an indicator light and a selection/decision/setting switch are provided on the upper surface orthogonal to the front surface and the rear surface. As for the photoelectric sensor, when the user sets/adjusts a threshold value, the selection/decision/setting switch is pressed first. Then, a certain threshold value is automatically set. Next, the user finely adjusts the threshold value by pressing the adjustment switch while viewing the display part.

When the detection distance is short, the photoelectric sensor is usually attached with the light projecting/receiving part facing down, and the display part and the two adjustment switches facing up, so that the optical axis is in the vertical direction.

In recent years, as the detection distance increases, photoelectric sensors are increasingly being attached with the optical axis in the horizontal direction. However, if the photoelectric sensor of Patent Document 1 is attached as such, the direction in which the adjustment switch is pressed becomes the horizontal direction, giving the user a feeling that it is difficult to press the adjustment switch as compared to pressing the adjustment switch downward when the detection distance is short. Due to this deterioration of operability, the direction and the position in which the photoelectric sensor of Patent Document 1 can be installed may be limited.

SUMMARY

According to an embodiment of the disclosure, a photoelectric sensor includes a light projecting part that emits light; a light receiving part that receives light; a housing that houses the light projecting part and the light receiving part; a setting part that receives an input operation from outside to set a threshold value; and an adjustment part that receives an input operation from outside to finely adjust the threshold value that has been set. The housing includes a first surface having a light projecting/receiving surface allowing light from the light projecting part and light to the light receiving part to pass; a second surface located on a side opposite to the first surface; a third surface adjacent to the first surface and extending in a direction orthogonal to the first surface and the second surface; and an inclined surface inclined with respect to the third surface and the second surface and connecting the third surface and the second surface. The adjustment part is provided on the inclined surface.

DESCRIPTION OF THE EMBODIMENTS

Figure 1:
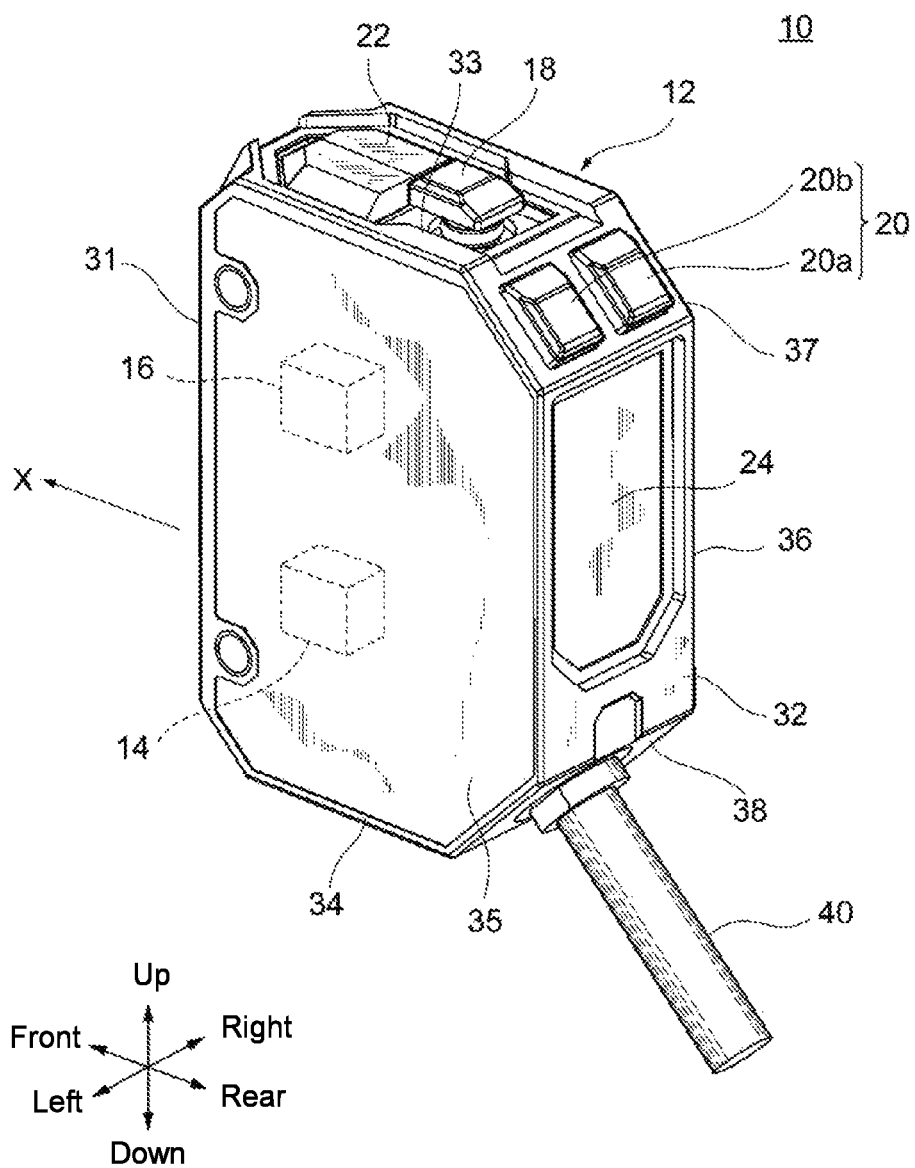
FIG. 1 is a perspective view of a photoelectric sensor according to an embodiment viewed from one direction.

The disclosure provides a photoelectric sensor with improved operability and installability.

According to an embodiment of the disclosure, a photoelectric sensor includes a light projecting part that emits light; a light receiving part that receives light; a housing that houses the light projecting part and the light receiving part; a setting part that receives an input operation from outside to set a threshold value; and an adjustment part that receives an input operation from outside to finely adjust the threshold value that has been set. The housing includes a first surface having a light projecting/receiving surface allowing light from the light projecting part and light to the light receiving part to pass; a second surface located on a side opposite to the first surface; a third surface adjacent to the first surface and extending in a direction orthogonal to the first surface and the second surface; and an inclined surface inclined with respect to the third surface and the second surface and connecting the third surface and the second surface. The adjustment part is provided on the inclined surface.

According to the embodiment, in installing the photoelectric sensor, the ease of performing the input operation on the adjustment part can be ensured regardless of whether the light projecting/receiving surface is oriented in the horizontal direction or the vertical direction. For example, if the photoelectric sensor is installed with the light projecting/receiving surface facing downward, the user can perform an input operation on the adjustment part on the inclined surface in the obliquely downward direction. Also, if the photoelectric sensor is installed with the light projecting/receiving surface facing sideways, the user can perform an input operation on the adjustment part on the inclined surface in the obliquely downward direction. As such, since the installation orientation of the photoelectric sensor can be adapted to the horizontal or the vertical direction, installability and operability of the photoelectric sensor can both be improved.

The inclined surface may be smaller than the second surface and the third surface. According to the embodiment, spaciousness of the second surface and the third surface can be ensured while miniaturizing the housing as a whole using the inclined surface. By ensuring spaciousness of the second surface and the third surface, the design with respect to the number, size, type, and the like of other functional parts that can be disposed here (for example, the setting part and the display part to be described later, etc.) can be flexible.

The setting part may be provided on the second surface or the third surface. According to the embodiment, the setting part can be provided on the second surface or the third surface with ensured spaciousness.

The second surface may be provided with a display part that displays the threshold value. According to the embodiment, the display part can be provided near the adjustment part. Thus, for example, the user can perform an input operation on the adjustment part while viewing the display of the display part, so that operability can be further improved. In addition, the surface on which the display part is provided is opposite to the light projecting/receiving surface. As a result, spaciousness of the display area of the display part and the area of the light projecting/receiving surface can be ensured while miniaturizing the housing as a whole using the inclined surface.

According to another embodiment of the disclosure, a photoelectric sensor includes a light projecting part that emits light; a light receiving part that receives light; a housing that houses the light projecting part and the light receiving part; a setting part that receives an input operation from outside to set a threshold value; and an adjustment part that receives an input operation from outside to finely adjust the threshold value that has been set. The housing has a substantially rectangular parallelepiped shape. The housing includes a first surface having a light projecting/receiving surface allowing light from the light projecting part and light to the light receiving part to pass; a second surface located on a side opposite to the first surface; a third surface adjacent to the first surface and extending in a direction orthogonal to the first surface and the second surface; and a chamfered region formed by chamfering a corner of the substantially rectangular parallelepiped shape so as to connect the third surface and the second surface. The adjustment part is provided in the chamfered region.

According to the embodiment, same as above, in installing the photoelectric sensor, the ease of performing an input operation on the adjustment part can be ensured regardless of whether the light projecting/receiving surface is oriented in the horizontal or the vertical direction. For example, if photoelectric sensor is installed with the light projecting/receiving surface facing downward, the user can perform an input operation on the adjustment part in the chamfered region in the obliquely downward direction. Also, if the photoelectric sensor is installed with the light projecting/receiving surface facing sideways, the user can also perform an input operation on the adjustment part in the chamfered region in the obliquely downward direction. As such, since the installation orientation of the photoelectric sensor can be adapted to the horizontal or the vertical direction, installability and operability of the photoelectric sensor can both be improved.

Here, the chamfer form is not limited to C chamfer (plane chamfer) and may be R chamfer (round chamfer) or reverse R chamfer (which is opposite to the direction of R chamfer. The surface of such chamfer may be referred to as a spoon surface or a lottery surface), or be formed from a combination of multiple surfaces.

Operability and installability of the photoelectric sensor can be improved.

Figure 2:
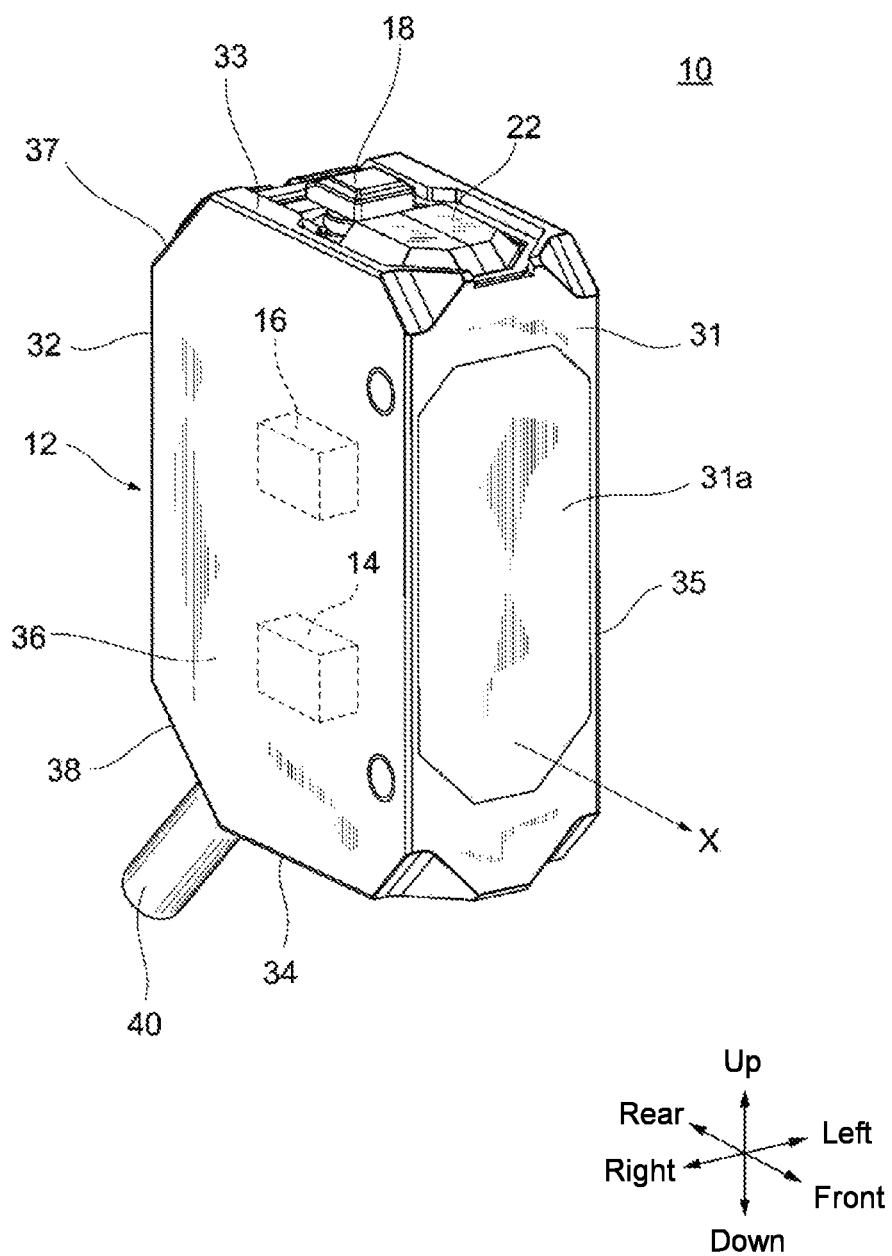
FIG. 2 is a perspective view of the photoelectric sensor of FIG. 1 viewed from another direction.

With reference to the accompanying drawings, a photoelectric sensor according to an exemplary embodiment of the disclosure will be described using a photoelectric sensor of range as an example. For convenience of explanation, references with respect to front, rear, left, right, top, and down, are made as shown in FIGS. 1 and 2. In each figure, parts denoted by the same reference numerals have the same or similar configurations.

As shown in FIGS. 1 and 2, a photoelectric sensor 10 has a housing 12. Inside the housing 12, a light projecting part 14 and a light receiving part 16 are accommodated. A teach button 18, an adjustment button 20, an indicator 22, and a display part 24 are provided on the outer surface of the housing 12.

The light projecting part 14 projects light to an object being detected, and has a light emitting element and a light projecting lens. The light emitting element is a laser diode for example with an optical axis X parallel to the front-rear direction. The light receiving part 16 receives the reflected light of the light projected to the object being detected and has a light receiving element and a light receiving lens. The light receiving element is, for example, a 2-division photodiode or a position detecting element. The principle of Time of Flight (TOF) or triangulation can be used, for example, as the detection principle of distance measurement for obtaining the distance to the object being detected. For example, when the principle of triangulation is used in the above configuration, the light emitted from the light emitting element is projected to the object being detected through the light projecting lens and the light reflected by the object being detected forms an image on the light receiving element through the light receiving lens. The light receiving element outputs two light receiving signals corresponding to the position of the formed image and transmits the signals to a control circuit via an amplifier. The amplifier and the control circuit are built in the photoelectric sensor 10. In the control circuit, the position signal value calculated from the two light receiving signals received is compared with a threshold value, and the distance to the object being detected is obtained.

The teach button 18 functions as a setting part for receiving an input operation from outside to set the threshold value. Here, the threshold value refers to a reference value for judging the presence or the absence of the object being detected or a distance to the object being detected in the photoelectric sensor 10, and is one of the sensitivity parameters for adjusting sensitivity. As the sensitivity parameters, in addition to the threshold value, the power of light emitted from the light projecting part 14, that is, the light projection intensity, and the amplification factor of the amount of light received by the light receiving part 16, that is, the gain, can be mentioned. For example, for detection of a transparent object with low reflectance, a high light projection intensity is set. When the user presses the teach button 18, a teaching process of setting the sensitivity parameter(s), including at least the threshold value, is performed and the sensitivity parameter(s), including at least the threshold value, is automatically set to a certain value. As the teaching process, there are for example, the 1-point teaching process and the 2-point teaching process. The details of the processes have been described in Patent Documents (for example, Japanese Laid-Open No. 2008-298614) and so on previously filed by the Applicant, so the descriptions thereof shall be omitted here.

The adjustment button 20 functions as an adjustment part for receiving an input operation from outside to finely adjust the threshold value set by the teach button 18. The adjustment button 20 has, for example, push type UP button 20a and DOWN button 20b. The UP button 20a and the DOWN button 20b are arranged side by side in the left-right direction. When the user presses the UP button 20a, the threshold value set by the teach button 18 changes one by one in an increasing direction, and when the user presses the DOWN button 20b, the threshold value changes one by one in a decreasing direction. Following the input operation from outside, the threshold value set by the teach button 18 is raised or lowered, and the threshold value to be used in the photoelectric sensor 10 is updated. Using the adjustment button 20, it is also possible to finely adjust other adjustable values apart from the threshold value. For example, it is possible to finely adjust brightness of the display part 24.

The indicator 22 is lit according to the power supply status or the detection condition of the photoelectric sensor 10. For example, the indicator 22 has a power light that lights up when the power is on and an operation indicator light that lights up when the object being detected is detected. The power light and the operation indicator light are each composed of an LED for example and are lit with different display colors. The display part 24 displays various kinds of information. For example, the display part 24 displays the threshold value set by the teach button 18, the threshold value at the time of making a fine adjustment by the adjustment button 20, a distance value up to the object being detected obtained by the photoelectric sensor 10, etc.

The housing 12 is made of resin or metal for example and has a substantially rectangular parallelepiped shape. The housing 12 has a front surface 31, a rear surface 32, a top surface 33, a bottom surface 34, a side surface 35, and a side surface 36 with respect to the six surfaces constituting the rectangular parallelepiped. The front surface 31 and the rear surface 32 are opposite to each other with the interior of the housing 12 interposed therebetween. Likewise, the top surface 33 and the bottom surface 34 are opposite to each other with the interior of the housing 12 interposed therebetween, and the side surface 35 and the side surface 36 are opposite to each other with the interior of the housing 12 interposed therebetween. The front surface 31 and the rear surface 32 are formed longer in the top-bottom direction than in the left-right direction. Similarly, the top surface 33 and the bottom surface 34 are formed longer in the front-rear direction than in the left-right direction, and the side surfaces 35 and 36 are formed longer in the top-bottom direction than in the front-rear direction. The front surface 31 has a light projecting/receiving surface 31a that allows light from the light projecting part 14 and light to the light receiving part 16 to pass. On the rear surface 32 located on the opposite side of the front surface 31, the display part 24 is provided. The top surface 33 is adjacent to the front surface 31 and extends in a direction orthogonal to the front surface 31 and the rear surface 32. On the top surface 33, the indicator 22 and the teach button 18 are provided in order from the side of the front surface 31.

The housing 12 has an inclined surface 37 and an inclined surface 38 at positions corresponding to two corners of the rectangular parallelepiped in addition to the six surfaces above. On the inclined surface 37, the adjustment button 20 is provided. More specifically, the UP button 20a and the DOWN button 20b of the adjustment button 20 are disposed on the inclined surface 37 with a predetermined gap in the left-right direction. A cord 40 is provided on the inclined surface 38. The cord 40 is used, for example, to send detection signals indicating the result detected by the photoelectric sensor 10 to the outside of the photoelectric sensor 10. The inclined surface 37 is inclined with respect to the rear surface 32 and the top surface 33 and connects the rear surface 32 and the top surface 33. Similarly, the inclined surface 38 is inclined with respect to the rear surface 32 and the bottom surface 34 and connects the two surfaces. The inclined surface 37 is smaller than the rear surface 32 and the top surface 33.

The "substantially rectangular parallelepiped shape" above with respect to the housing 12 does not mean a rectangular parallelepiped whose interior angles are all 90 degrees, but at least refers to a rectangular parallelepiped having one corner chamfered like the inclined surface 37.

The photoelectric sensor 10 according to the embodiment described above includes the light projecting part 14 that emits light, the light receiving part 16 that receives light, the housing 12 that houses the light projecting part 14 and the light receiving part 16, the teach button 18 for receiving an input operation from outside to set the threshold value, and the adjustment button 20 for receiving an input operation from outside to finely adjust the threshold value. The housing 12 includes the front surface 31 having the light projecting/receiving surface 31a for light from the light projecting part 14 and light to the light receiving part 16 to pass, the rear surface 32 located on the opposite side of the front surface 31, the top surface 33 adjacent to the front surface 31 and extending in a direction orthogonal to the front surface 31 and the rear surface 32, and the inclined surface 37 inclined with respect to the top surface 33 and the rear surface 32 and connecting the top surface 33 and the rear surface 32. The adjustment button 20 is provided on the inclined surface 37. According to the embodiment, in installing the photoelectric sensor 10, the ease of the input operation to the adjustment button 20 can be ensured regardless of whether the light projecting/receiving surface 31a is oriented in the horizontal direction or the vertical direction.

Figure 3:
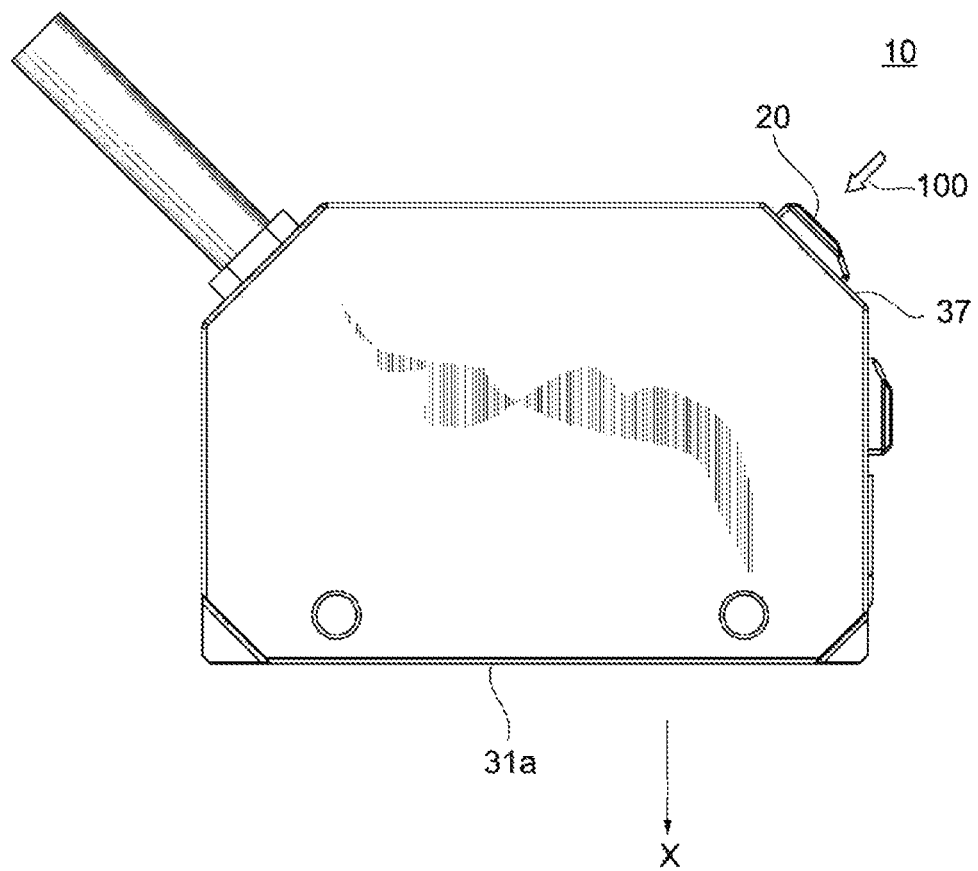
FIG. 3 is a view illustrating an example in which the photoelectric sensor of FIG. 1 is installed in the vertical direction.
Figure 4:
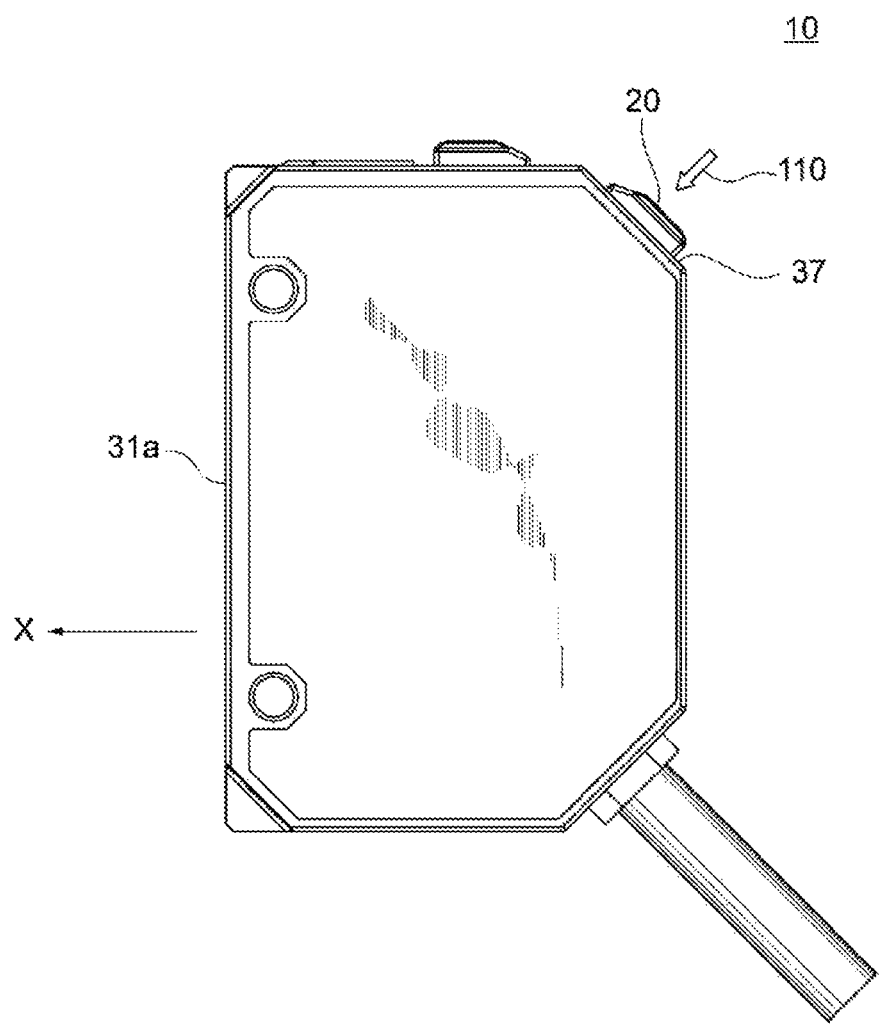
FIG. 4 is a view illustrating an example in which the photoelectric sensor of FIG. 1 is installed in the horizontal direction.

For example, as shown in FIG. 3, when the photoelectric sensor 10 is installed such that the light projecting/receiving surface 31a faces downward and the optical axis X is parallel to the vertical direction, the user can press the adjustment button 20 on the inclined surface 37 in the obliquely downward direction 100. Similarly, as shown in FIG. 4, even when the photoelectric sensor 10 is installed such that the light projecting/receiving surface 31a is oriented sideways and the optical axis X is parallel to the horizontal direction, the user can press the adjustment button 20 on the inclined surface 37 in the obliquely downward direction 110. As such, in either case, the user can perform the input operation on the adjustment button 20 in the obliquely downward direction, giving the user an interval that performing the input operation on the adjustment button 20 is easy. Therefore, installability and operability of the photoelectric sensor 10 can both be improved.

In particular, since the input operation to the adjustment button 20 is performed through push, it is easy to press the button obliquely downward. Furthermore, since the UP button 20a and the DOWN button 20b of the adjustment button 20 are arranged side by side, it is easy to make fine adjustments of increase/decrease.

Also, since the inclined surface 37 is smaller than the rear surface 32 and the top surface 33, spaciousness of the rear surface 32 and the top surface 33 can be ensured while miniaturizing the housing 12 as a whole using the inclined surface 37. By ensuring spaciousness of the rear surface 32 and the top surface 33, the design with respect to the number, size, type, and the like of other functional parts that can be disposed here (for example, the display part 24 on the rear surface 32 and the teach button 18 and the indicator 22 on the top surface 33) can be flexible.

Also, since the display part 24 for displaying the threshold value is provided on the rear surface 32, the display part 24 can be provided near the adjustment button 20. Thus, for example, the user can perform the input operation on the adjustment button 20 while viewing the display of the display part 24, so that operability can be further improved. In addition, the surface on which the display part 24 is provided is on the opposite side to the light projecting/receiving surface 31*a*. As a result, spaciousness of the display area of the display part 24 and the area of the light projecting/receiving surface 31*a* can be ensured while miniaturizing the housing 12 as a whole using the inclined surface 37.

The embodiments described above are intended to facilitate understanding of the disclosure and shall not be construed as limitations to the disclosure. The elements included in the embodiments and their arrangements, materials, conditions, shapes, sizes, and the like are not limited to those exemplified and can be appropriately changed.

For example, the direction of side-by-side arrangement of the UP button 20*a* and the DOWN button 20*b* of the adjustment button 20 can be set in the top-bottom direction or the oblique direction. However, from the viewpoint of making the inclined surface 37 smaller than the rear surface 32 and the top surface 33 and ensuring spaciousness of the rear surface 32 and the top surface 33, it is better to set the side-by-side arrangement in the left-right direction as described above. Furthermore, the adjustment button 20 may be composed of one button. In addition, although the adjustment button 20 of the push type is illustrated as an example for the adjustment part, the disclosure is not limited thereto and another type of the adjustment part such as a seesaw type, a volume dial type, a trimmer type, a jog dial type or the like can also be adopted.

Furthermore, the positions of the teach button 18, the indicator 22 and the display part 24 on the housing 12 may be changed. For example, the teach button 18 may be provided on the rear surface 32 and the display part 24 may be provided on the top surface 33. The inclination angle of the inclined surface 37 can be appropriately designed in consideration of ease of performing the input operation on the adjustment button 20, miniaturization of the housing 12, ensuring the area of the rear surface 32 and the top surface 33, and the like.

In addition, although the chamfered region formed by chamfering the corner of the substantially rectangular parallelepiped shape of the housing 12 is constituted by the planar inclined surface 37, the disclosure is not limited thereto and the chamfered region may be constituted by a curved surface. That is, the chamfer form for forming the chamfered region is not limited to C chamfer (plane chamfer) that forms the inclined surface 37, and may be R chamfer (round chamfer) that forms a curved surface or reverse R chamfer (which is opposite to the direction of R chamfer. The surface of such chamfer may be referred to as a spoon surface or a lottery surface). The adjustment part may be provided in the chamfered region of such a curved surface, so as to connect the rear surface 32 and the top surface 33. In addition, the chamfered region may be formed from a combination of multiple surfaces.

APPENDIX

1. A photoelectric sensor 10, including a light projecting part 14 that emits light, a light receiving part 16 that receives light, a housing 12 that houses the light projecting part 14 and the light receiving part 16, a teach button 18 that receives an input operation from outside to set a threshold value, and an adjustment button 20 that receives an input operation from outside to finely adjust the threshold value that has been set, wherein the housing 12 includes:

a front surface 31 having a light projecting/receiving surface 31*a* allowing light from the light projecting part 14 and light to the light receiving part 16 to pass;

a rear surface 32 located on a side opposite to the front surface 31;

a top surface 33 adjacent to the front surface 31 and extending in a direction orthogonal to the front surface 31 and the rear surface 32; and an inclined surface 37 inclined with respect to the top surface 33 and the rear surface 32 and connecting the top surface 33 and the rear surface 32, wherein the adjustment button 20 is provided on the inclined surface 37.

5. A photoelectric sensor 10, including a light projecting part 14 that emits light, a light receiving part 16 that receives light, a housing 12 that houses the light projecting part 14 and the light receiving part 16, a teach button 18 that receives an input operation from outside to set a threshold value, and an adjustment button 20 that receives an input operation from outside to finely adjust the threshold value that has been set, wherein the housing 12 has a substantially rectangular parallelepiped shape, and the housing 12 includes:

a front surface 31 having a light projecting/receiving surface 31*a* allowing light from the light projecting part 14 and light to the light receiving part 16 to pass;

a rear surface 32 located on a side opposite to the front surface 31;

a top surface 33 adjacent to the front surface 31 and extending in a direction orthogonal to the front surface 31 and the rear surface 32; and a chamfered region formed by chamfering a corner of the substantially rectangular parallelepiped shape so as to connect the top surface 33 and the rear surface 32, and the adjustment button 20 is provided in the chamfered region.

What is claimed is:

1. A photoelectric sensor, comprising a light projecting part that emits light, a light receiving part that receives light, a housing that houses the light projecting part and the light receiving part, a setting part that receives an input operation from outside to set a threshold value, and an adjustment part that receives an input operation from outside to finely adjust the threshold value that has been set, wherein the housing comprises:

a first surface having a light projecting/receiving surface allowing light from the light projecting part and light to the light receiving part to pass;

a second surface located on a side opposite to the first surface;

a third surface adjacent to the first surface and extending in a direction orthogonal to the first surface and the second surface; and an inclined surface inclined with respect to the third surface and the second surface and connecting the third surface and the second surface, wherein the adjustment part is provided on the inclined surface.

2. The photoelectric sensor according to claim 1, wherein the inclined surface is smaller than the second surface and the third surface.

3. The photoelectric sensor according to claim 2, wherein the setting part is provided on the second surface or the third surface.

4. The photoelectric sensor according to claim 3, wherein the second surface is provided with a display part for displaying the threshold value.

5. The photoelectric sensor according to claim 2, wherein the second surface is provided with a display part for displaying the threshold value.

6. The photoelectric sensor according to claim 1, wherein the second surface is provided with a display part for displaying the threshold value.

7. A photoelectric sensor, comprising a light projecting part that emits light, a light receiving part that receives light, a housing that houses the light projecting part and the light receiving part, a setting part that receives an input operation from outside to set a threshold value, and an adjustment part that receives an input operation from outside to finely adjust the threshold value that has been set, wherein the housing has a substantially rectangular parallelepiped shape, and the housing comprises:

a first surface having a light projecting/receiving surface allowing light from the light projecting part and light to the light receiving part to pass;

a second surface located on a side opposite to the first surface;

a third surface adjacent to the first surface and extending in a direction orthogonal to the first surface and the second surface; and a chamfered region formed by chamfering a corner of the substantially rectangular parallelepiped shape so as to connect the third surface and the second surface, wherein the adjustment part is provided in the chamfered region.

* * * * *